(12) United States Patent
Gao et al.

(10) Patent No.: US 12,389,750 B2
(45) Date of Patent: Aug. 12, 2025

(54) DISPLAY PANEL, DISPLAY DEVICE, AND METHOD FOR PREPARING DISPLAY PANEL

(71) Applicants: Hefei BOE Joint Technology Co., Ltd., Anhui (CN); BOE Technology Group Co., Ltd., Beijing (CN)

(72) Inventors: Xinwei Gao, Beijing (CN); Huaiting Shih, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 518 days.

(21) Appl. No.: 17/799,385

(22) PCT Filed: Oct. 22, 2021

(86) PCT No.: PCT/CN2021/125861
§ 371 (c)(1),
(2) Date: Aug. 12, 2022

(87) PCT Pub. No.: WO2022/156291
PCT Pub. Date: Jul. 28, 2022

(65) Prior Publication Data
US 2023/0345765 A1    Oct. 26, 2023

(30) Foreign Application Priority Data

Jan. 25, 2021 (CN) .......................... 202110097027.7

(51) Int. Cl.
*H10K 59/122* (2023.01)
*H10K 50/15* (2023.01)
(Continued)

(52) U.S. Cl.
CPC ........... *H10K 59/122* (2023.02); *H10K 50/15* (2023.02); *H10K 50/16* (2023.02);
(Continued)

(58) Field of Classification Search
CPC ...... H10K 50/15; H10K 50/16; H10K 59/122; H10K 2101/30; H10K 59/35;
(Continued)

(56) References Cited

U.S. PATENT DOCUMENTS

2003/0168972 A1* 9/2003 Hamada ................. H10K 59/35
313/504
2006/0158403 A1 7/2006 Kuma
(Continued)

FOREIGN PATENT DOCUMENTS

CN         1985546 A    6/2007
CN       103890992 A    6/2014
(Continued)

OTHER PUBLICATIONS

CN202110097027.7 first office action.

*Primary Examiner* — Didarul A Mazumder
(74) *Attorney, Agent, or Firm* — IPro, PLLC (57) ABSTRACT

A display panel includes: a base substrate; a first electrode layer; a pixel defining layer provided with a plurality of pixel openings; a light-emitting layer provided with a plurality of light-emitting portions within the pixel openings; an electron transport layer, including a plurality of electron transport portions within the pixel openings and on sides of the light-emitting portions facing away from the first electrode layer, wherein each electron transport portion is made of a light-emitting material that is different from the corresponding light-emitting portion within the same pixel opening in color of emitted light, and a light-emitting center of each of the pixel openings is located within the corresponding light-emitting portion; and a second electrode layer, on a side of the electron transport layer facing away from the light-emitting layer.

13 Claims, 3 Drawing Sheets

(51) Int. Cl.
*H10K 50/16* (2023.01)
*H10K 59/12* (2023.01)
*H10K 71/13* (2023.01)
*H10K 101/30* (2023.01)

(52) U.S. Cl.
CPC ....... *H10K 59/1201* (2023.02); *H10K 71/135* (2023.02); *H10K 2101/30* (2023.02)

(58) Field of Classification Search
CPC .. H10K 59/1201; H10K 71/135; H10K 50/13; H10K 50/166; H10K 50/165
USPC ........................................ 257/40; 438/82, 99
See application file for complete search history.

(56) References Cited

U.S. PATENT DOCUMENTS

| | | | |
|---|---|---|---|
| 2008/0018239 A1 | 1/2008 | Matsuda et al. | |
| 2014/0252340 A1 | 9/2014 | Wang | |
| 2014/0353635 A1 | 12/2014 | Chou et al. | |
| 2015/0236075 A1* | 8/2015 | Jeong | H10K 50/166 257/40 |
| 2015/0303393 A1* | 10/2015 | Dai | H10K 50/11 438/46 |
| 2016/0248039 A1* | 8/2016 | Choung | H10K 50/828 |
| 2017/0125719 A1* | 5/2017 | Noh | H10K 59/122 |
| 2017/0125745 A1* | 5/2017 | Lee | H10K 71/00 |
| 2018/0301521 A1* | 10/2018 | Yang | H10K 59/35 |
| 2019/0157364 A1* | 5/2019 | Yan | H10K 59/122 |
| 2019/0305054 A1* | 10/2019 | Tsukamoto | H10K 71/00 |
| 2020/0212336 A1* | 7/2020 | Heo | H10K 50/15 |
| 2020/0343322 A1* | 10/2020 | Jia | H10K 59/122 |
| 2021/0335902 A1 | 10/2021 | Ai | |
| 2021/0367011 A1 | 11/2021 | Bing | |

FOREIGN PATENT DOCUMENTS

| | | |
|---|---|---|
| CN | 110931526 A | 3/2020 |
| CN | 111063831 A | 4/2020 |
| CN | 112838173 A | 5/2021 |
| JP | 2007207916 A | 8/2007 |

\* cited by examiner

DISPLAY PANEL, DISPLAY DEVICE, AND METHOD FOR PREPARING DISPLAY PANEL

CROSS REFERENCE TO RELATED APPLICATIONS

This application is a national phase entry under 35 U.S.C. § 371 of International Application No. PCT/CN2021/125861, filed on Oct. 22, 2021, which claims priority to Chinese Patent Application No. 202110097027.7, filed with the China National Intellectual Property Administration on Jan. 25, 2021 and entitled "DISPLAY PANEL, DISPLAY DEVICE, AND METHOD FOR PREPARING DISPLAY PANEL", the entire contents of which are incorporated herein by reference.

FIELD

The present disclosure relates to the technical field of semiconductors, in particular to a display panel, a display device, and a method for preparing a display panel.

BACKGROUND

Inkjet printing is currently a hot technology in the development of organic light emitting technology due to its advantages of simple process, low cost, and capability of realizing top-emission light emission. In an inkjet printing process, film layers of an organic light-emitting device are generally printed in the order of a hole injection layer, a hole transport layer and a light-emitting layer. According to the printing process, materials of the film layers need to be dissolved in solvents and then printed. One of the difficulties in development of printing materials is to find solvents and materials that are compatible in process on all layers (i.e., when subsequent film layers are printed, the condition of not dissolving the previously formed film layers needs to be met and is more demanding). Currently, only a hole injection layer, a hole transport layer and a light-emitting layer can be formed in an organic light-emitting device by the printing process, but an electron transport layer cannot be formed by the printing process. Such a device structure tends to cause imbalance in transport of electrons and holes in the organic light-emitting device, and then cause poor emission position of the light-emitting excitons, thus affecting the efficiency and lifetime of the organic light-emitting device.

SUMMARY

The present disclosure provides a display panel, a display device, and a method for preparing a display panel to ameliorate problems of carrier injection imbalance, low luminous efficiency, and short lifetime of a display panel formed by inkjet printing in the prior art.

Embodiments of the present disclosure provide a display panel, including:
 a base substrate;
 a first electrode layer, located on a side of the base substrate;
 a pixel defining layer, located on a side of the first electrode layer facing away from the base substrate, and provided with a plurality of pixel openings;
 a light-emitting layer, provided with a plurality of light-emitting portions located within the pixel openings;
 an electron transport layer, including a plurality of electron transport portions located within the pixel openings and located on sides of the light-emitting portions facing away from the first electrode layer, wherein a color of emitted light of a light-emitting material of an electro transport portion within one pixel opening is different from a color of emitted light of a light-emitting portion within the one pixel opening; and a light-emitting center of the one pixel opening is within the light-emitting portion; and
 a second electrode layer, located on a side of the electron transport layer facing away from the light-emitting layer.

In a possible implementation, within the same pixel opening, a LUMO energy level of the electron transport portion matches a LUMO energy level of the light-emitting portion.

In a possible implementation, the pixel openings include a red pixel opening, a green pixel opening and a blue pixel opening; the light-emitting portions include a red light-emitting portion located within the red pixel opening, a green light-emitting portion located within the green pixel opening, and a blue light-emitting portion located within the blue pixel opening; the electron transport portions include a red electron transport portion located within the red pixel opening, a green pixel electron transport portion located within the green pixel opening, and a blue pixel electron transport portion located within the blue pixel opening.

A color of emitted light of a light-emitting material of each of the red pixel electron transport portion and the blue pixel electron transport portion is same as a color of emitted light of the green light-emitting portion.

In a possible implementation, the red pixel electron transport portion and the blue pixel electron transport portion are made of the same material.

In a possible implementation, the red pixel electron transport portion and the green light-emitting portion are made of the same material.

In a possible implementation, a color of emitted light of a light-emitting material of the green pixel electron transport portion is same as a color of emitted light of the blue light-emitting portion.

In a possible implementation, the green pixel electron transport portion and the blue light-emitting portion are made of the same material.

In a possible implementation, a surface of the electron transport portion facing away from the light-emitting portion is taken as a first surface, and a surface of the base substrate facing the first electrode layer is taken as a second surface, and the distance between the first surface and the second surface is smaller than a depth of the pixel opening.

In a possible implementation, the first electrode layer is an anode layer, and the second electrode layer is a cathode layer.

The display panel further includes hole injection portions located within the pixel openings and located between the first electrode layer and the light-emitting portions, and hole transport portions located between the hole injection portions and the light-emitting portions.

Embodiments of the present disclosure further provide a display device including the display panel as provided in the embodiments of the present disclosure.

Embodiments of the present disclosure further provide a method for preparing a display panel, including:
 forming a first electrode layer on a side of a base substrate;
 forming a pixel defining layer provided with a plurality of pixel openings on a side of the first electrode layer facing away from the base substrate;

forming light-emitting portions and electron transport portions located on sides of the light-emitting portions facing away from the first electrode layer within the pixel openings in multiple inkjet printing processes, wherein a color of emitted light of a light-emitting material of an electro transport portion within one pixel opening is different from a color of emitted light of a light-emitting portion within the one pixel opening; and a light-emitting center of the one pixel opening is within the light-emitting portion; and forming a second electrode layer on sides of the electron transport portions facing away from the light-emitting portions.

In a possible implementation, the pixel openings include a red pixel opening, a green pixel opening and a blue pixel opening.

The forming light-emitting portions and electron transport portions located on sides of the light-emitting portions facing away from the first electrode layer within the pixel openings in multiple inkjet printing processes includes:

forming a red light-emitting portion within the red pixel opening in an inkjet printing process;

forming a blue light-emitting portion within the blue pixel opening in an inkjet printing process;

forming green light-emitting portions within all the pixel openings in an inkjet printing process, wherein the green light-emitting portion within the red pixel opening is taken as a red pixel electron transport portion, and the green light-emitting portion within the blue pixel opening is taken as a blue pixel electron transport portion; and forming a green pixel electron transport portion within the green pixel opening in an inkjet printing process; wherein the green pixel electron transport portion and the blue light-emitting portion are made of a same material.

In a possible implementation, after forming a pixel defining layer provided with a plurality of pixel openings on a side of the first electrode layer facing away from the base substrate, and before forming light-emitting portions and electron transport portions located on sides of the light-emitting portions facing away from the first electrode layer within the pixel openings in multiple inkjet printing processes, the method further includes:

forming hole injection portions within the pixel opening in an inkjet printing process; and forming hole transport portions within the pixel opening in an inkjet printing process.

The beneficial effects of the embodiments of the present disclosure are as follows: in embodiments of the present disclosure, an electron transport portion made of a light-emitting material is formed within each pixel opening and on a side of the light-emitting portion facing away from the first electrode layer. Since the light-emitting material typically also has electron transport capability, and a formation process of and the printing liquid used by the electron transport portion made of the light-emitting material may also be the same as or similar to those of the light-emitting layer formed in the previous step, and further other film layers formed in the previous steps can be prevented from being dissolved when the electron transport layer is formed, thereby forming an electron transport layer of a display panel by an inkjet printing process, and ameliorating problems of carrier injection imbalance, low luminous efficiency, and short lifetime of a formed light-emitting panel caused by the fact that when an electron transport layer of a display panel formed by inkjet printing in the prior art is formed, since the previous film layer is easy to dissolve, the electron transport layer cannot be formed, and problems of poor pixel dark spots and the like caused by the fact that the film layers of the display panel formed by inkjet printing in the prior art are thin. In addition, the light-emitting center of each pixel opening is located within the corresponding light-emitting portion, so that the problem of color mixing that may occur when light-emitting materials emitting light of different colors are formed within the same pixel opening.

DETAILED DESCRIPTION OF THE EMBODIMENTS

In order to make the purposes, technical solutions and advantages of the embodiments of the present disclosure clearer, the technical solutions of the embodiments of the present disclosure will be clearly and completely described below in conjunction with the accompanying drawings of the embodiments of the present disclosure. Obviously, the described embodiments are some, but not all, embodiments of the present disclosure. All other embodiments obtained by a person of ordinary skill in the art based on the described embodiments of the present disclosure without creative work fall within the scope of protection of the present disclosure.

Unless otherwise defined, technical or scientific terms used herein shall have the ordinary meaning as understood by a person of ordinary skill in the art to which the present disclosure belongs. Words such as "first" and "second" used herein do not denote any order, quantity, or importance, but are merely used to distinguish different components. Words such as "including" or "containing" means that elements or items appearing before the word encompass elements or items listed after the word and equivalents thereof, but do not exclude other elements or items. Words such as "connection" or "connected" are not limited to physical or mechanical connection, but may include electrical connection, whether direct or indirect. Words such as "up", "down", "left" and "right" are only used to indicate the relative positional relationship, and when the absolute position of the described object changes, the relative positional relationship may change accordingly.

In order to keep the following description of the embodiments of the present disclosure clear and concise, the present disclosure omits detailed descriptions of known functions and known components.

Figure 1:
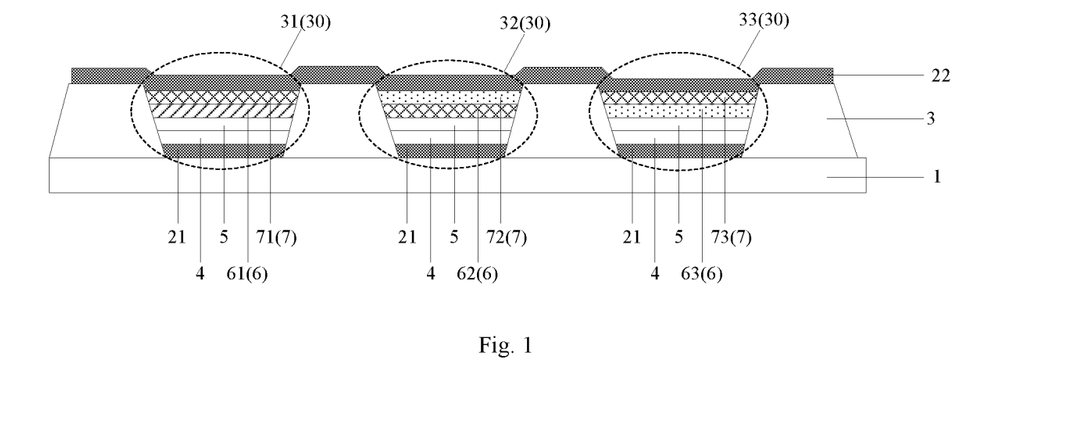
FIG. 1 is a structural schematic diagram of a display panel according to an embodiment of the present disclosure.

Referring to FIG. 1, embodiments of the present disclosure provide a display panel, including:

a base substrate 1;

a first electrode layer 21, located on one side of the base substrate 1;

a pixel defining layer 3, located on a side of the first electrode layer 21 facing away from the base substrate 1, and provided with a plurality of pixel openings 30;

a light-emitting layer, provided with a plurality of light-emitting portions 6 located within the pixel openings 30;

an electron transport layer, including a plurality of electron transport portions 7 located within the pixel openings 30 and located on sides of the light-emitting portions 6 facing away from the first electrode layer 21, wherein each electron transport portion 7 is made of a light-emitting material that is different from the light-emitting portion 6 within the same pixel opening 30 in color of emitted light, and a light-emitting center of each of the pixel openings 30 is located within the corresponding light-emitting portion 6; and a second electrode layer 22, located on a side of the electron transport layer facing away from the light-emitting layer.

In the embodiments of the present disclosure, the electron transport portion 7 made of a light-emitting material is formed within each pixel opening 30 and on a side of the light-emitting portion 6 facing away from the first electrode layer 21, since the light-emitting material typically also has electron transport capability, and a formation process of and the printing liquid used by the electron transport portion 7 made of the light-emitting material may also be the same as or similar to those of the light-emitting layer 6 formed in the previous step, and further other film layers formed in the previous steps can be prevented from being dissolved when the electron transport layer is formed, thereby forming an electron transport layer of a display panel by an inkjet printing process, and ameliorating problems of carrier injection imbalance, low luminous efficiency, and short lifetime of a formed light-emitting panel caused by the fact that when an electron transport layer of a display panel formed by inkjet printing in the prior art is formed, since the previous film layer is easy to dissolve, the electron transport layer cannot be formed, and problems of poor pixel dark spots and the like caused by the fact that the film layers of the display panel formed by inkjet printing in the prior art are thin. In addition, the light-emitting center of each of the pixel openings 30 is located within the corresponding light-emitting portion 6, so that the problem of color mixing that may occur when light-emitting materials emitting light of different colors are formed within the same pixel opening 30.

In specific implementations, the light-emitting center of each specific pixel opening 30 is made to be located within the corresponding light-emitting portion 6 by adjusting the thickness of film layers according to the specific materials of the film layers in the pixel opening 30.

In specific implementations, within the same pixel opening 30, the LUMO energy level of the electron transport portion 7 matches the LUMO energy level of the light-emitting portion 6. Specifically, the LUMO energy level of the electron transport portion 7 matching the LUMO energy level of the light-emitting portion 6 means that the energy level difference between the LUMO energy level of the electron transport portion 7 and the LUMO energy level of the light-emitting portion 6 is less than a preset threshold. The preset threshold can make the electron transition easier. In the embodiments of the present disclosure, within the same pixel opening 30, by enabling the LUMO energy level of the electron transport portion 7 made of the light-emitting material to match the LUMO energy level of the light-emitting portion 6, the transition barrier of electrons can be reduced, so that the problem of imbalance between hole injection and electron injection of the display panel caused by the fact that fewer electrons are injected can be avoided.

Specifically, referring to FIG. 1, the pixel openings 30 include a red pixel opening 31, a green pixel opening 32 and a blue pixel opening 33. The light-emitting portions 6 include a red light-emitting portion 61 located within the red pixel opening 31, a green light-emitting portion 62 located within the green pixel opening 32, and a blue light-emitting portion 63 located within the blue pixel opening 32. The electron transport portions 7 include a red electron transport portion 71 located within the red pixel opening 31, a green pixel electron transport portion 72 located within the green pixel opening 32, and a blue pixel electron transport portion 73 located within the blue pixel opening 32. The red pixel electron transport portion 71 and the blue pixel electron transport portion 73 are each made of a light-emitting material that is the same as the green light-emitting portion 62 in color of emitted light, that is, the red pixel electron transport portion 71 and the blue pixel electron transport portion 73 are the same in color of emitted light, and both the same as the green light-emitting portion 62 in color of emitted light. In the embodiments of the present disclosure, since the LIMO energy level of a blue light-emitting material is higher than the LUMO energy level of a green light-emitting material, and the LUMO energy level of the green light-emitting material is higher than the LUMO energy level of a red light-emitting material, for the red pixel and the blue pixel, a blue light-emitting material of which the LUMO energy level is close to the LUMO energy levels of the corresponding light-emitting portions in the red pixel and the blue pixel is selected from the light-emitting materials as the electron transport material, so that within the red pixel, the LUMO energy level of the red electron transport portion 71 matches the LUMO energy level of the red light-emitting portion 61 relatively, thus facilitating electron transition; similarly, within the blue pixel, the LUMO energy level of the blue pixel electron transport portion 73 also matches the LUMO energy level of the blue light-emitting portion 63, thus facilitating electron transition.

In specific implementations, the red pixel electron transport portion 71 and the blue pixel electron transport portion 73 are made of the same material. Specifically, the red pixel electron transport portion 71 and the green light-emitting portion 62 are made of the same material, that is, the red pixel electron transport portion 71 and the green light-emitting portion 62 are made of the same material, and the blue pixel electron transport portion 73 and the green light-emitting portion 62 are also made of the same material, so that the red pixel electron transport portion 71 and the blue pixel electron transport portion 73 can be formed while the green light-emitting portion 62 is formed by an inkjet printing process, and accordingly, the preparing process of the display panel can be greatly simplified, and the preparing cost of the display panel can be reduced.

In specific implementations, the green pixel electron transport portion 72 is made of a light-emitting material that is the same as the blue light-emitting portion 63 in color of emitted light. In the embodiments of the present disclosure, since the LUMO energy level of the blue light-emitting material matches the LUMO energy level of the green light-emitting material relatively, a light-emitting material that is the same as the blue light-emitting portion 63 in color of emitted light is selected as the green electron transport portion 72, thus facilitating electron transition in a green pixel.

Specifically, the green pixel electron transport portion 72 and the blue light-emitting portion 63 are made of the same material. In the embodiments of the present disclosure, the green pixel electron transport portion 72 and the blue light-emitting portion 63 are made of the same material, so that the green pixel electron transport portion 72 can be formed from a material for fabricating the blue light-emitting portion 63, and accordingly, the preparing process of the display panel can be simplified, and the preparing cost of the display panel can be reduced.

Figure 2:
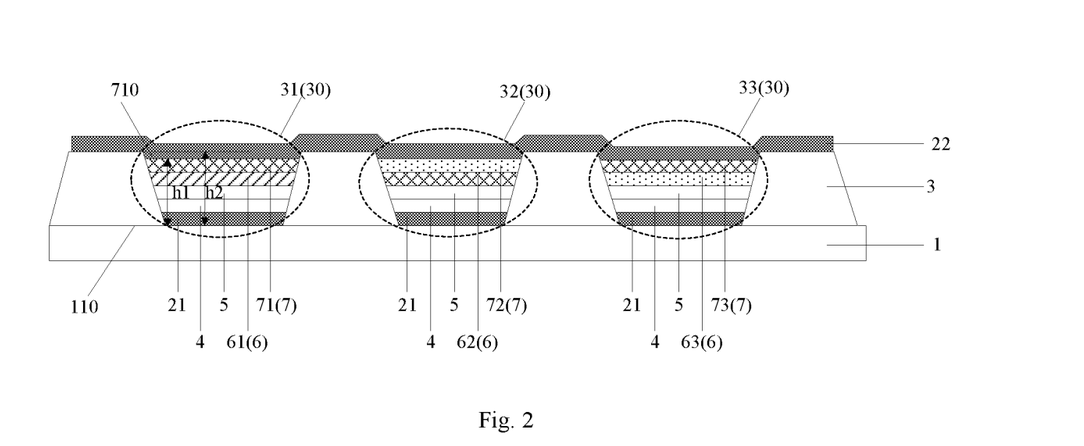
FIG. 2 is a structural schematic diagram of another display panel according to an embodiment of the present disclosure.

In specific implementations, referring to FIG. 2, a surface of the electron transport portion 7 facing away from the light-emitting portion 6 is taken as a first surface 710, a surface of the base substrate 1 facing the first electrode layer 21 is taken as a second surface 110, the distance h1 between the first surface 710 and the second surface 110 is smaller than the depth h2 of the pixel opening. In the embodiments of the present disclosure, the distance h1 between the first surface 710 and the second surface 110 is smaller than the depth h2 of the pixel opening. while forming the electron transport portion 6 by inkjet printing, the material for printing the electron transport portion 6 is limited and blocked by a portion of the pixel defining layer 3 except the pixel opening 30.

In specific implementations, referring to FIG. 1 or FIG. 2, the first electrode layer 21 is an anode layer, and the second electrode layer 22 is a cathode layer. The display panel further includes hole injection portions 4 located within the pixel openings 30 and located between the first electrode layer 21 and the light-emitting portions 6, and hole transport portions 5 located between the hole injection portions 4 and the light-emitting portions 6. Specifically, the hole injection portions 4 and the hole transport portions 5 may also be formed in the pixel opening by inkjet printing to balance injection of electrons and holes.

Specifically, the hole injection portion 4 may have a thickness of 10 nm to 200 nm, the hole transport portion 5 may have a thickness of 10 nm to 200 nm, the light-emitting portion 6 may have a thickness of 10 nm to 200 nm, and the electron transport portion 7 may have a thickness of 10 nm to 150 nm.

Based on the same inventive concept, embodiments of the present disclosure further provide a display device including the display panel as provided by embodiments of the present disclosure.

Figure 3:
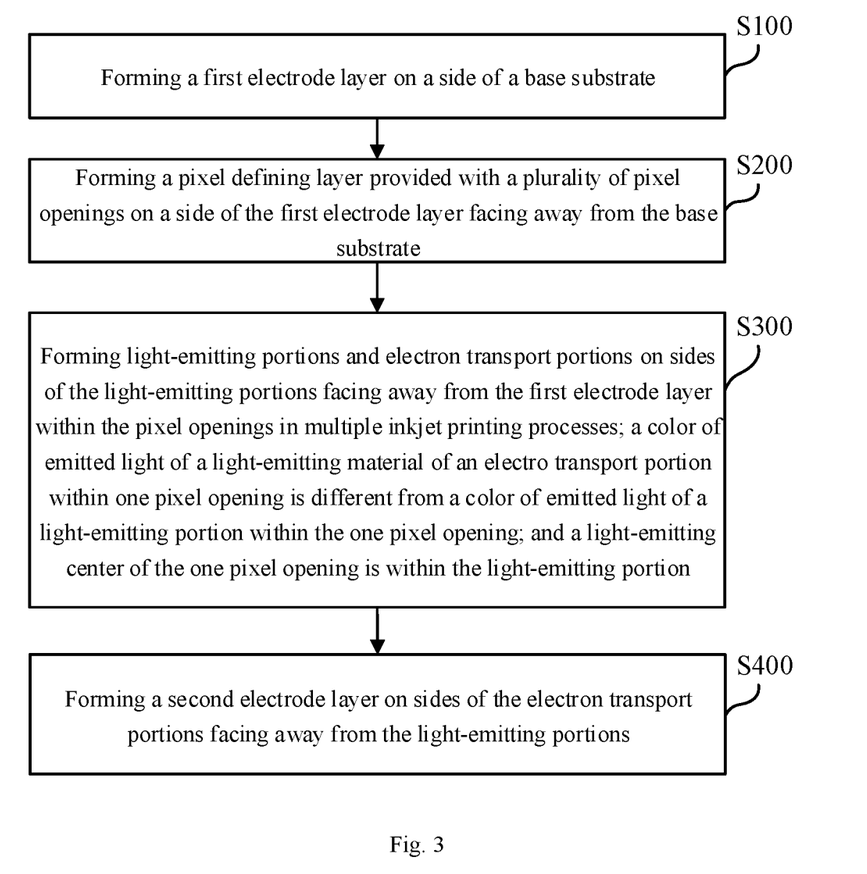
FIG. 3 is a flowchart of a method for preparing a display panel according to an embodiment of the present disclosure.

Based on the same inventive concept, embodiments of the present disclosure further provide a method for preparing a display panel, referring to FIG. 3, including the following steps.

S100, forming a first electrode layer on a side of a base substrate.

S200, forming a pixel defining layer provided with a plurality of pixel openings on a side of the first electrode layer facing away from the base substrate.

S300, forming light-emitting portions and electron transport portions located on sides of the light-emitting portions facing away from the first electrode layer within the pixel openings in multiple inkjet printing processes, wherein a color of emitted light of a light-emitting material of an electro transport portion within one pixel opening is different from a color of emitted light of a light-emitting portion within the one pixel opening; and a light-emitting center of the one pixel opening is within the light-emitting portion.

Specifically, the pixel openings include a red pixel opening, a green pixel opening and a blue pixel opening; S300 of forming light-emitting portions and electron transport portions located on sides of the light-emitting portions facing away from the first electrode layer within the pixel openings in multiple inkjet printing processes may include:

forming a red light-emitting portion within the red pixel opening in an inkjet printing process;

forming a blue light-emitting portion within the blue pixel opening in an inkjet printing process;

forming green light-emitting portions within all pixel openings in an inkjet printing process, wherein the green light-emitting portion within the red pixel opening is taken as a red pixel electron transport portion, and the green light-emitting portion within the blue pixel opening is taken as a blue pixel electron transport portion; and forming a green pixel electron transport portion within the green pixel opening in an inkjet printing process; wherein the green pixel electron transport portion and the blue light-emitting portion are made of a same material.

S400, forming a second electrode layer on sides of the electron transport portions facing away from the light-emitting portions.

Figure 4:
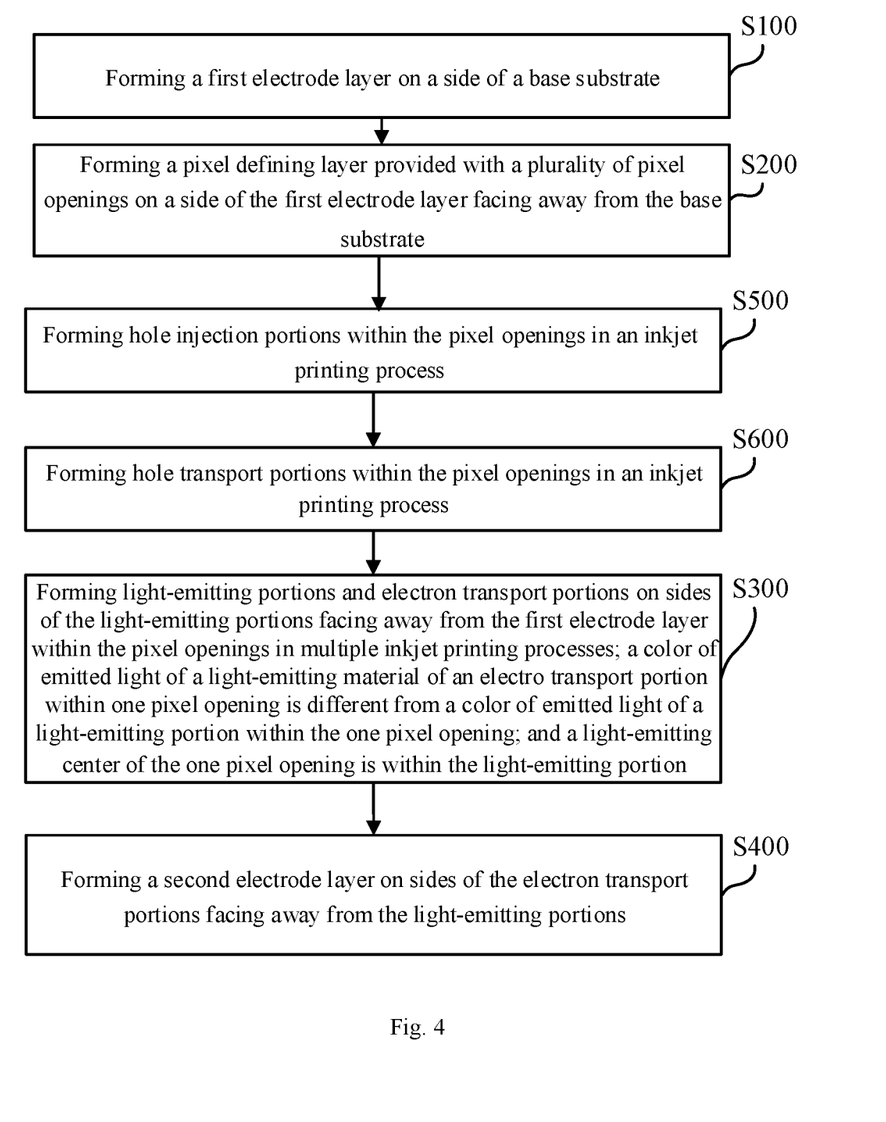
FIG. 4 is a specific flowchart of a method for preparing a display panel according to an embodiment of the present disclosure.

In specific implementation, referring to FIG. 4, after S200 and before S300, i.e., after forming a pixel defining layer provided with a plurality of pixel openings on a side of the first electrode layer facing away from the base substrate, and before forming light-emitting portions and electron transport portions located on sides of the light-emitting portions facing away from the first electrode layer within the pixel openings in multiple inkjet printing processes, the method further includes:

S500, forming hole injection portions within the pixel openings in an inkjet printing process;

S600, forming hole transport portions within the pixel opening in an inkjet printing process.

The beneficial effects of the embodiments of the present disclosure are as follows: in embodiments of the present disclosure, an electron transport portion made of a light-emitting material is formed within each pixel opening and on a side of the light-emitting portion facing away from the first electrode layer, since the light-emitting material typically also has electron transport capability, and a formation process of and the printing liquid used by the electron transport portion made of the light-emitting material may also be the same as or similar to those of the light-emitting layer formed in the previous step, and further other film layers formed in the previous steps can be prevented from being dissolved when the electron transport layer is formed, thereby forming an electron transport layer of a display panel by an inkjet printing process, and ameliorating problems of carrier injection imbalance, low luminous efficiency, and short lifetime of a formed light-emitting panel caused by the fact that when an electron transport layer of a display panel formed by inkjet printing in the prior art is formed, since the previous film layer is easy to dissolve, the electron transport layer cannot be formed, and problems of poor pixel dark spots and the like caused by the fact that the film layers of the display panel formed by inkjet printing in the prior art are thin; in addition, the light-emitting center of each pixel opening is located within the corresponding light-emitting portion, so that the problem of color mixing that may occur when light-emitting materials emitting light of different colors are formed within the same pixel opening.

It will be apparent to those skilled in the art that various modifications and variations can be made to the present disclosure without departing from the spirit and scope of the present disclosure. Thus, if these modifications and variations of the present disclosure fall within the scope of the claims of the present disclosure and their equivalents, the present disclosure is also intended to include these modifications and variations.

What is claimed is:

1. A display panel, comprising:
   a base substrate;
   a first electrode layer on a side of the base substrate;
   a pixel defining layer on a side of the first electrode layer facing away from the base substrate; the pixel defining layer being provided with a plurality of pixel openings;
   a light-emitting layer provided with a plurality of light-emitting portions within the plurality of pixel openings;
   an electron transport layer, comprising:
      a plurality of electron transport portions, within the plurality of pixel openings and on sides of the plurality of light-emitting portions facing away from the first electrode layer;
      wherein a color of emitted light of a light-emitting material of an electron transport portion of the plurality of electron transport portions within one pixel opening is different from a color of emitted light of a light-emitting portion of the plurality of light-emitting portions within the one pixel opening; and
      a light-emitting center of the one pixel opening is within the light-emitting portion of the plurality of light-emitting portions within the one pixel opening; and
   a second electrode layer on a side of the electron transport layer facing away from the light-emitting layer.

2. The display panel according to claim 1, wherein a LUMO energy level of the electron transport portion of the plurality of electron transport portions within the one pixel opening matches a LUMO energy level of the light-emitting portion of the plurality of light-emitting portions within the one pixel opening.

3. The display panel according to claim 2, wherein,
   the plurality of pixel openings comprise:
      a red pixel opening,
      a green pixel opening, and
      a blue pixel opening;
   the plurality of light-emitting portions comprise:
      a red light-emitting portion within the red pixel opening,
      a green light-emitting portion within the green pixel opening, and
      a blue light-emitting portion within the blue pixel opening;
   the plurality of electron transport portions comprise:
      a red electron transport portion within the red pixel opening,
      a green pixel electron transport portion within the green pixel opening, and
      a blue pixel electron transport portion within the blue pixel opening;
   wherein a color of emitted light of a light-emitting material of each of the red pixel electron transport portion and the blue pixel electron transport portion is same as a color of emitted light of the green light-emitting portion.

4. The display panel according to claim 3, wherein the red pixel electron transport portion and the blue pixel electron transport portion are made of a same material.

5. The display panel according to claim 4, wherein the red pixel electron transport portion and the green light-emitting portion are made of a same material.

6. The display panel according to claim 3, wherein a color of emitted light of a light-emitting material of the green pixel electron transport portion is same as a color of emitted light of the blue light-emitting portion.

7. The display panel according to claim 6, wherein the green pixel electron transport portion and the blue light-emitting portion are made of a same material.

8. The display panel according to claim 1, wherein, a surface of the plurality of electron transport portions facing away from the plurality of light-emitting portions is taken as a first surface;
   a surface of the base substrate facing the first electrode layer is taken as a second surface; and
   a distance between the first surface and the second surface is smaller than a depth of the plurality of pixel openings.

9. The display panel according to claim 1, wherein, the first electrode layer is an anode layer;
   the second electrode layer is a cathode layer; and
   the display panel further comprises:
      hole injection portions, within the plurality of pixel openings and between the first electrode layer and the plurality of light-emitting portions; and
      hole transport portions, between the hole injection portions and the plurality of light-emitting portions.

10. A display device, comprising the display panel according to claim 1.

11. A method for preparing a display panel, comprising:
    forming a first electrode layer on a side of a base substrate;
    forming a pixel defining layer provided with a plurality of pixel openings on a side of the first electrode layer facing away from the base substrate;
    forming light-emitting portions and electron transport portions on sides of the light-emitting portions facing away from the first electrode layer within the plurality of pixel openings in multiple inkjet printing processes, wherein a color of emitted light of a light-emitting material of an electron transport portion of the electron transport portions within one pixel opening is different from a color of emitted light of a light-emitting portion of the light-emitting portions within the one pixel opening; and a light-emitting center of the one pixel opening is within the light-emitting portion of the light-emitting portions within the one pixel opening; and
    forming a second electrode layer on sides of the electron transport portions facing away from the light-emitting portions.

12. The method according to claim 11, wherein the plurality of pixel openings comprise a red pixel opening, a green pixel opening, and a blue pixel opening;
    forming the light-emitting portions and the electron transport portions on sides of the light-emitting portions facing away from the first electrode layer within the plurality of pixel openings in multiple inkjet printing processes, comprises:
    forming a red light-emitting portion within the red pixel opening in an inkjet printing process;
    forming a blue light-emitting portion within the blue pixel opening in an inkjet printing process;
    forming green light-emitting portions within all the plurality of pixel openings in an inkjet printing process; wherein a green light-emitting portion within the red pixel opening is taken as a red pixel electron transport portion, and a green light-emitting portion within the blue pixel opening is taken as a blue pixel electron transport portion; and forming a green pixel electron transport portion within the green pixel opening in an inkjet printing process; wherein the green pixel electron transport portion and the blue light-emitting portion are made of a same material.

13. The method according to claim 12, wherein, after forming the pixel defining layer provided with the plurality of pixel openings on the side of the first electrode layer facing away from the base substrate, and before forming the light-emitting portions and the electron transport portions on sides of the light-emitting portions facing away from the first electrode layer within the pixel openings in the multiple inkjet printing processes, the method further comprises:
forming hole injection portions within the plurality of pixel openings in an inkjet printing process; and
forming hole transport portions within the plurality of pixel openings in an inkjet printing process.

\* \* \* \* \*